US012701826B2

(12) United States Patent
Lee

(10) Patent No.: US 12,701,826 B2
(45) Date of Patent: Aug. 4, 2026

(54) DISPLAY DEVICE AND MANUFACTURING METHOD FOR LIGHT EMITTING ELEMENT

(71) Applicant: Samsung Display Co., LTD., Yongin-si (KR)

(72) Inventor: Jong Won Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 795 days.

(21) Appl. No.: 17/861,873

(22) Filed: Jul. 11, 2022

(65) Prior Publication Data

US 2023/0087256 A1 Mar. 23, 2023

(30) Foreign Application Priority Data

Sep. 23, 2021 (KR) ........................ 10-2021-0125858

(51) Int. Cl.
| | |
|---|---|
| *H10H 20/81* | (2025.01) |
| *H10H 20/01* | (2025.01) |
| *H10H 20/825* | (2025.01) |
| *H10H 20/84* | (2025.01) |
| *H10W 70/60* | (2026.01) |
| *H10W 90/00* | (2026.01) |
| *H10W 90/22* | (2026.01) |

(52) U.S. Cl.
CPC .. *H10H 20/8215* (2025.01); *H10H 20/01335* (2025.01); *H10H 20/018* (2025.01); *H10H 20/8252* (2025.01); *H10H 20/84* (2025.01); *H10W 70/60* (2026.01); *H10W 90/00* (2026.01); *H10W 90/22* (2026.01)

(58) Field of Classification Search
CPC ........... H10H 20/8215; H10H 20/8252; H10H 20/01335; H10H 20/018; H10H 20/84; H10H 20/034; H10H 20/821; H10H 20/819; H10H 20/812; H10H 20/01; H10H 20/811; H10H 20/822; H10H 20/83; H10W 70/60; H10W 90/00; H10W 90/22

See application file for complete search history.

(56) References Cited

U.S. PATENT DOCUMENTS

| | | | |
|---|---|---|---|
| 10,396,241 B1 | 8/2019 | Perkins | |
| 2013/0105836 A1* | 5/2013 | Yokozeki | ............... H10H 20/81 257/E33.014 |
| 2020/0313040 A1* | 10/2020 | Nishioka | ................. G03B 3/10 |
| 2022/0102585 A1 | 3/2022 | Lee et al. | |

FOREIGN PATENT DOCUMENTS

| | | |
|---|---|---|
| KR | 10-0551942 | 2/2006 |
| KR | 10-1386132 | 4/2014 |
| KR | 10-2022-0044043 | 4/2022 |

OTHER PUBLICATIONS

Matthew S. Wong et al., "High efficiency of III-nitride micro-light-emitting diodes by sidewall passivation using atomic layer deposition", Optics Express, Aug. 6, 2018, pp. 21324-21331, vol. 26, No. 16.

* cited by examiner

*Primary Examiner* — Calvin Y Choi
(74) *Attorney, Agent, or Firm* — Womble Bond Dickinson (US) LLP

(57) ABSTRACT

A display device includes a first electrode and a second electrode, spaced apart from each other, and a light emitting element disposed between the first electrode and the second electrode. The light emitting element includes a core area and a doping area surrounding the core area.

10 Claims, 9 Drawing Sheets

DISPLAY DEVICE AND MANUFACTURING METHOD FOR LIGHT EMITTING ELEMENT

CROSS-REFERENCE TO RELATED APPLICATION(S)

The application claims priority to and benefits of Korean patent application 10-2021-0125858 under 35 U.S.C. § 119, filed in the Korean Intellectual Property Office on Sep. 23, 2021, the entire contents of which are incorporated herein by reference.

BACKGROUND

1. Technical Field

The disclosure generally relates to a display device including a light emitting element having improved efficiency and reliability and a manufacturing method for the light emitting element.

2. Description of Related Art

Information displays have grown in popularity, and the importance of display devices has been emphasized because of the increasing research and developments of information technology.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device including a light emitting element having improved efficiency and reliability.

Embodiments also provide a manufacturing method for a light emitting element having improved efficiency and reliability.

However, embodiments of the disclosure are not limited to those set forth herein. The above and other embodiments will become more apparent to one of ordinary skill in the art to which the disclosure pertains by referencing the detailed description of the disclosure given below.

In accordance with an aspect of the disclosure, there is provided a display device including a first electrode and a second electrode, spaced apart from each other; and a light emitting element disposed between the first electrode and the second electrode, wherein the light emitting element includes a core area and a doping area surrounding the core area.

The light emitting element may include a first semiconductor layer; a second semiconductor layer disposed on the first semiconductor layer; and an active layer disposed between the first semiconductor layer and the second semiconductor layer.

The doping area may overlap the first semiconductor layer, the second semiconductor layer, and the active layer in a plan view.

The doping area may partially overlap the active layer in a plan view.

The active layer may include barrier layers and well layers that are alternately stacked.

The doping area may overlap the barrier layers and the well layers in a plan view.

The doping area may partially overlap the well layers in a plan view.

A thickness of the doping area may be smaller than a diameter of the core area.

The thickness of the doping area may be about 100 nm or less.

A doping concentration of the doping area may be higher than a doping concentration of the core area.

The display device may further include an insulative film surrounding the doping area.

The display device may further include a first connection electrode electrically connected to the first semiconductor layer; and a second connection electrode electrically connected to the second semiconductor layer.

In accordance with another aspect of the disclosure, there is provided a method for manufacturing a light emitting element, the method including forming a light emitting stack structure on a stack substrate; etching the light emitting stack structure to form a light emitting pattern; and implanting a dopant into a surface of the light emitting pattern to form a doping area.

The light emitting stack structure may include a first semiconductor layer; a second semiconductor layer disposed on the first semiconductor layer; and an active layer disposed between the first semiconductor layer and the second semiconductor layer.

At least one of the first semiconductor layer, the second semiconductor layer, and the active layer may overlap the doping area.

The dopant may include at least one of Si, Sn, Te, Se, S, O, Ti, and Ge.

The dopant may include at least one of Zn, Fe, Mg, Be, Cd, Ag, C, Hg, Li, and Ca.

A doping concentration of the doping area may be in a range of about $1E16/cm^3$ to about $1E23/cm^3$.

The light emitting pattern may include a core area surrounded by the doping area. In the forming of the doping area, the core area may not be doped.

The method may further include forming an insulative film on the doping area of the light emitting pattern.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
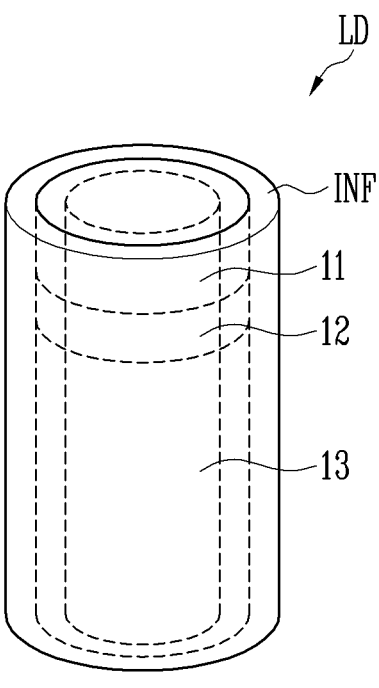
FIG. 1 is a schematic perspective view illustrating a light emitting element in accordance with an embodiment of the disclosure.

The effects and characteristics of the present disclosure and a method of achieving the effects and characteristics will be clear by referring to the embodiments described below in detail together with the accompanying drawings. However, the disclosure is not limited to the embodiments disclosed herein but may be implemented in various forms. The embodiments are provided by way of example only so that a person of ordinary skilled in the art can fully understand the features in the present disclosure and the scope thereof. Therefore, the present disclosure can be defined by the scope of the appended claims.

The terminology used herein is for the purpose of describing particular embodiments only and is not construed as limiting the disclosure. As used herein, the singular forms are intended to include the plural forms (or meanings) as well, unless the context clearly indicates otherwise. The terms "comprises/includes" and/or "comprising/including," when used in this specification, specify the presence of mentioned component, step, operation and/or element, but do not exclude the presence or addition of one or more other components, steps, operations and/or elements.

When described as that any element is "connected", "coupled" or "accessed" to another element, it should be understood that it is possible that still another element may "connected", "coupled" or "accessed" between the two elements as well as that the two elements are directly "connected", "coupled" or "accessed" to each other.

The term "on" that is used to designate that an element or layer is on another element or layer includes both a case where an element or layer is located directly on another element or layer, and a case where an element or layer is located on another element or layer via still another element layer. Like reference numerals generally denote like elements throughout the specification.

It will be understood that, although the terms "first," "second," and the like may be used herein to describe various elements, these elements should not be limited by these terms. These terms are only used to distinguish one element from another element. Thus, a "first" element discussed below could also be termed a "second" element without departing from the teachings of the present disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, exemplary embodiments of the disclosure will be described in more detail with reference to the accompanying drawings.

Figure 2:
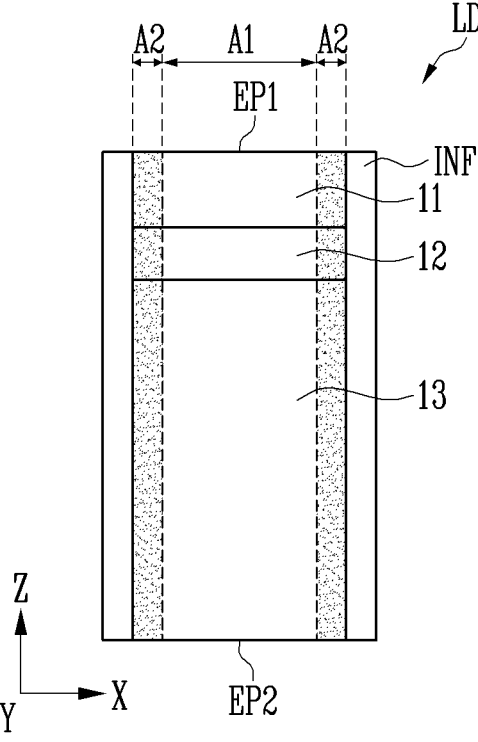
FIG. 2 is a schematic cross-sectional view illustrating the light emitting element in accordance with the embodiment of the disclosure.

FIG. 1 is a schematic perspective view illustrating a light emitting element in accordance with an embodiment of the disclosure. FIG. 2 is a schematic cross-sectional view illustrating the light emitting element in accordance with the embodiment of the disclosure. Although a pillar-shaped light emitting element LD is illustrated in FIGS. 1 and 2, the kind and/or shape of the light emitting element LD are/is not limited thereto.

Referring to FIGS. 1 and 2, the light emitting element LD may include a first semiconductor layer 11, an active layer 12, and a second semiconductor layer 13.

The light emitting element LD may be provided in a pillar shape extending in a direction. The light emitting element LD may have a first end portion EP1 and a second end portion EP2. One of the first and second semiconductor layers 11 and 13 may be disposed at the first end portion EP1 of the light emitting element LD. Another of the first and second semiconductor layers 11 and 13 may be disposed at the second end portion EP2 of the light emitting element LD. For example, the first semiconductor layer 11 may be disposed at the first end portion EP1 of the light emitting element LD, and the second semiconductor layer 13 may be disposed at the second end portion EP2 of the light emitting element LD.

In some embodiments, the light emitting element LD may be a light emitting element manufactured in a pillar shape through an etching process, etc. In the specification, the term "pillar shape" may include a rod-like shape or a bar-like shape, which has an aspect ratio greater than about 1, such as a cylinder or a polyprism, and the shape of a cross section of the light emitting element LD is not limited thereto.

The light emitting element LD may have a size small to a degree of nanometer scale to micrometer scale. For example, the light emitting element LD may have a diameter (or width) in a range of nanometer scale to micrometer scale and/or a length in a range of nanometer scale to micrometer scale. However, the size of the light emitting element LD is not limited thereto. The size of the light emitting element LD may be variously changed according to design conditions of various types of devices (e.g., display device, or the like), which use a light emitting device using the light emitting element LD as a light source.

The first semiconductor layer 11 may be a first conductivity type semiconductor layer. For example, the first semiconductor layer 11 may include a p-type semiconductor layer. For example, the first semiconductor layer 11 may include at least one semiconductor material of InAlGaN, GaN, AlGaN, InGaN, and AlN, and include a p-type semiconductor layer doped with a first dopant including at least one of Zn, Fe, Mg, Be, Cd, Ag, C, Hg, Li, and Ca. However, the material forming (or constituting) the first semiconductor layer 11 is not limited thereto. The first semiconductor layer 11 may be configured with (or include) various materials.

The active layer 12 may be disposed between the first semiconductor layer 11 and the second semiconductor layer 13. The active layer 12 may include any one structure of a single well structure, a multi-well structure, a single quantum well structure, a multi-quantum well (MQW) structure, a quantum dot structure, and a quantum wire structure, but the disclosure is not limited thereto. The active layer 12 may include at least one of GaN, InGaN, InAlGaN, AlGaN, and AlN. However, the disclosure is not limited thereto. The active layer 12 may be configured with various materials.

In case that a voltage which is a threshold voltage or more is applied to both ends of the light emitting element LD, the light emitting element LD emits light as electron-hole pairs are combined in the active layer 12. The light emission of the light emitting element LD may be controlled by using such a principle (e.g., combination of electron-hole pairs), and the light emitting element LD may be used as a light source for various light emitting devices. For example, the light emitting element LD may be used as a light source of a pixel of the display device.

The second semiconductor layer 13 may be disposed on the active layer 12, and may include a semiconductor layer having a type different from that of the first semiconductor layer 11. The second semiconductor layer 13 may include an n-type semiconductor layer. For example, the second semiconductor layer 13 may include at least one semiconductor material of InAlGaN, GaN, AlGaN, InGaN, and AlN, and include an n-type semiconductor layer doped with a second dopant including at least one of Si, Sn, Te, Se, S, O, Ti, and Ge. However, the material constituting the second semiconductor layer 13 is not limited thereto. The second semiconductor layer 13 may be configured with various materials.

The light emitting element LD may include a core area A1 and a doping area A2 surrounding the core area A1. The doping area A2 may be an area selectively or intensively doped in a surface of the light emitting element LD, and may function to improve the efficiency and reliability of the light emitting element LD by minimizing a surface energy band bending phenomenon even in case that a defect occurs in the surface of the light emitting element LD in a process of etching the light emitting element LD. For example, a Fermi energy pinning phenomenon may occur due to a surface defect caused by a dangling bond after the light emitting element LD is etched, and therefore, behavior of carriers may be influenced due occurrence of a band bending phenomenon of a surface energy band (conduction band, or valence band). In an example, a concentration of the electrons may be considerably decreased on the surface (or portion adjacent to surface) of the light emitting element LD. For example, a concentration of the holes may be accumulated on the surface (or portion adjacent to surface) of the light emitting element LD. Therefore, the efficiency and reliability of the light emitting element LD may be deteriorated. Accordingly, the doping area A2 is formed in the surface of the light emitting element LD, so that a Fermi energy level is adjusted, thereby minimizing the surface energy band bending phenomenon. The distribution of carriers may be readily controlled, and the efficiency and reliability of the light emitting element LD may be improved.

The doping area A2 may surround an outer circumferential surface of the core area A1. The core area A1 may extend in a direction (e.g., third direction or Z-axis direction) in which the first semiconductor layer 11, the active layer 12, and the second semiconductor layer 13 are stacked, and the doping area A2 may surround a side surface of the core area A1.

The doping area A2 may be formed by implanting a dopant into surfaces of the first semiconductor layer 11, the active layer 12, and the second semiconductor layer 13. The dopant may be the first dopant including at least one of Zn, Fe, Mg, Be, Cd, Ag, C, Hg, Li, and Ca. As another example, the dopant may be the second dopant including at least one of Si, Sn, Te, Se, S, O, Ti, and Ge. However, the disclosure is not limited thereto.

A doping concentration of the doping area A2 may be higher than that of the core area A1. For example, the core area A1 may be an area which is not doped in the process of implanting the dopant into the surfaces of the first semiconductor layer 11, the active layer 12, and the second semiconductor layer 13. The doping concentration of the doping area A2 may be in a range of about $1E16/cm^3$ to about $1E23/cm^3$, but the disclosure is not limited thereto.

A thickness (or depth) of the doping area A2 in a first direction (e.g., X-axis direction) may be smaller than a diameter of the core area A1 in the first direction (e.g., X-axis direction). In case that a thickness of the doping area A2 in the first direction (e.g., X-axis direction) is excessively greater than a diameter of the core area A1 in the first direction (e.g., X-axis direction), an internal defect of the core area A1 is caused as doping is deepened, and therefore, the flow of current in the core area A1 may be influenced. For example, the diameter of the core area A1 in the first direction (e.g., X-axis direction) may be in a range of about 500 nm to about 600 nm, and the thickness of the doping area A2 in the first direction (e.g., X-axis direction) may be about 100 nm or less. However, the disclosure is not limited thereto, and the thickness of the doping area A2 in the first direction (e.g., X-axis direction) may be variously changed within a range in which the flow of current in the core area A1 is not influenced. Detailed descriptions of a doping phase (or process) will be described in detail with reference to FIG. 8.

The doping area A2 may overlap at least one of the first semiconductor layer 11, the active layer 12, and the second semiconductor layer 13 (e.g., in a plan view). For example, as shown in FIG. 2, the doping area A2 may overlap the first semiconductor layer 11, the active layer 12, and the second semiconductor layer 13. However, the disclosure is not limited thereto, and the doping area A2 may partially or selectively overlap some of the first semiconductor layer 11, the active layer 12, and the second semiconductor layer 13.

In some embodiments, an insulative film INF may be further disposed on the first semiconductor layer 11, the active layer 12, and/or the second semiconductor layer 13. For example, the insulative film INF may surround side surfaces (or outer surfaces) of the first semiconductor layer 11, the active layer 12, and/or the second semiconductor layer 13. The insulative film INF may be disposed (e.g., directly disposed) on surfaces of the first semiconductor layer 11, the active layer 12, and/or the second semiconductor layer 13. For example, the insulative film INF may surround the doping area A2.

The insulative film INF may expose the first and second end portions EP1 and EP2 of the light emitting element LD, which have different polarities. In some embodiments, the insulative film INF may expose side portions of the semiconductor layers 11 and 13 adjacent to the first and second end portions EP1 and EP2 of the light emitting element LD.

The insulative film INF may prevent an electrical short circuit which may occur in case that the active layer 12 contacts a conductive material except the first and second semiconductor layers 11 and 13. Also, the insulative film INF may minimize a surface defect of light emitting elements LD, and the lifespan and light emission efficiency of the light emitting elements LD may be improved.

The insulative film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). For example, the insulative film INF may be configured as a double layer, and layers constituting the double layer of the insulative film INF may include different materials. For example, the insulative film INF may be configured as a double layer including aluminum oxide ($AlO_x$) and silicon oxide ($SiO_x$), but the disclosure is not limited thereto. In some embodiments, the insulative film INF may be omitted.

In some embodiments, an electrode layer (not shown) may be further disposed on the first end portion EP1 and/or the second end portion EP2 of the light emitting element LD. The electrode layer may include a transparent metal or a transparent metal oxide. For example, the electrode layer may include at least one of indium tin oxide (ITO), indium zinc oxide (IZO), and zinc tin oxide (ZTO), but the disclosure is not limited thereto. In case that the electrode layer is made of a transparent metal or a transparent metal oxide, light generated in the active layer 12 of the light emitting element LD may be emitted to the outside of the light emitting element LD while passing through the electrode layer.

A light emitting device including the above-described light emitting element LD may be used in various kinds of devices which require a light source, including a display device. For example, light emitting elements LD may be disposed in each pixel of a display panel, and be used as a light source of each pixel. However, the application field of the light emitting element LD is not limited to the above-described example. For example, the light emitting element LD may be used in other types of devices that require a light source, such as a lighting device.

Hereinafter, another embodiment will be described. In the following embodiment, components identical to those described above are designated by like reference numerals, and overlapping descriptions will be omitted or simplified.

Figure 3:
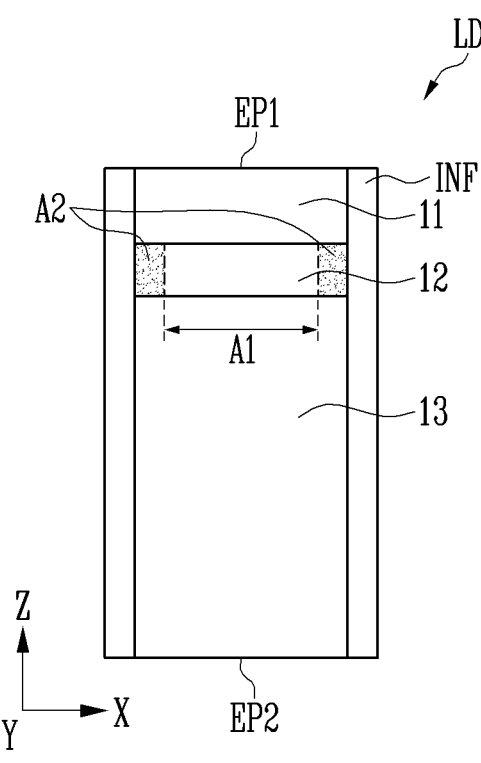
FIG. 3 is a schematic perspective view illustrating a light emitting element in accordance with another embodiment of the disclosure.
Figure 4:
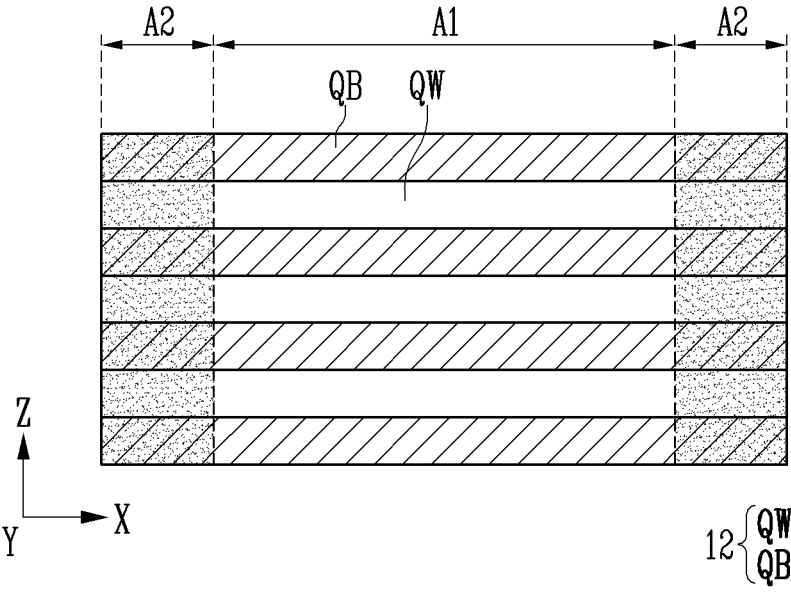
FIGS. 4 and 5 are schematic enlarged cross-sectional views of an active layer shown in FIG. 3.
Figure 5:
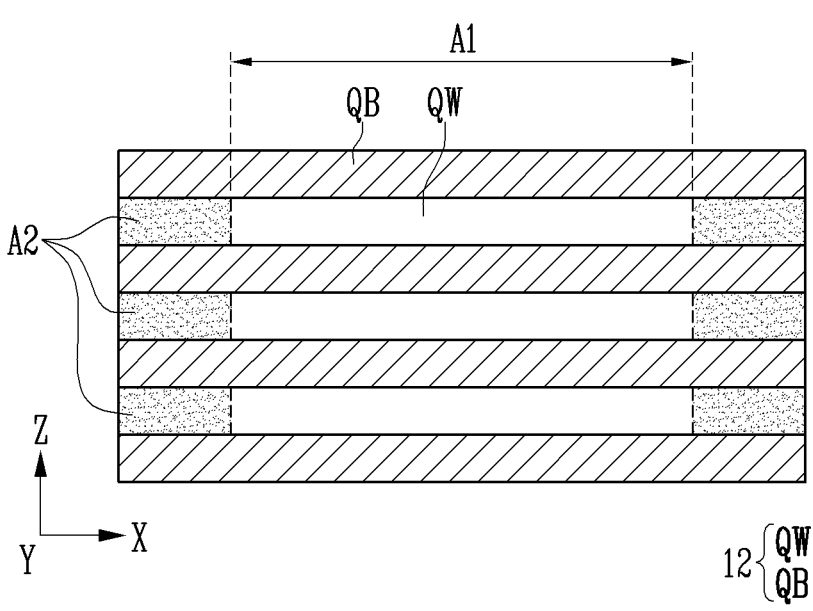

FIG. 3 is a schematic perspective view illustrating a light emitting element in accordance with another embodiment of the disclosure. FIGS. 4 and 5 are schematic enlarged cross sectional views of an active layer shown in FIG. 3.

Referring to FIGS. 3 to 5, a light emitting element LD in accordance with this embodiment is distinguished from the embodiment shown in FIGS. 1 and 2, at least in that a doping area A2 partially overlaps the active layer 12 (e.g., in a plan view).

For example, the doping area A2 may selectively overlap the active layer 12. For example, the doping area A2 may not overlap the first semiconductor layer 11 and/or the second semiconductor layer 13. The doping area A2 may be formed by selectively implanting a dopant into a surface of the active layer 12. For example, the dopant may be selectively implanted only into the surface of the active layer 12 to form the doping area A2.

Referring to FIGS. 4 and 5, the active layer 12 may include barrier layers QB and well layers QW. For example, the barrier layers QB may have different band gap energies from the well layers QW. The well layers QW may be formed of a material having a band gap energy smaller than that of the barrier layers QB. For example, the well layers QW may include InGaN, and the barrier layers QB may include GaN. However, the disclosure is not limited thereto. The barrier layers QB and the well layers QW may be alternately stacked, but the disclosure is not limited thereto.

The doping area A2 may overlap at least one of the barrier layers QB and the well layers QW. For example, as shown in FIG. 4, the doping area A2 may overlap the barrier layers QB and the well layers QW. However, the disclosure is not limited thereto, and the doping area A2 may partially overlap the well layers QW as shown in FIG. 5. For example, the doping area A2 may selectively overlap the well layers QW, and may not overlap the barrier layers QB. The doping area A2 may be formed by selectively doping surfaces of the well layers QW.

In accordance with the embodiment described above, the doping area A2 having a thickness (e.g., a predetermined or selected thickness) is formed by selectively doping a surface of the light emitting element LD, e.g., the active layer 12, even when a defect occurs in the surface of the light emitting element LD in a process of etching the light emitting element LD, so that the surface energy band bending phenomenon can be minimized, thereby improving the efficiency and reliability of the light emitting element LD, which has been described above.

Continuously, a manufacturing method for the light emitting elements in accordance with the above-described embodiments will be described.

FIGS. 6 to 10 are schematic process cross-sectional views illustrating a manufacturing method for a light emitting element in accordance with an embodiment of the disclosure. FIGS. 6 to 10 are cross-sectional views illustrating the light emitting element shown in FIGS. 1 and 2. In FIGS. 6 to 10, components substantially identical to those shown in FIGS. 1 and 2 are designated by like reference numerals, and their detailed descriptions will be omitted.

Figure 6:
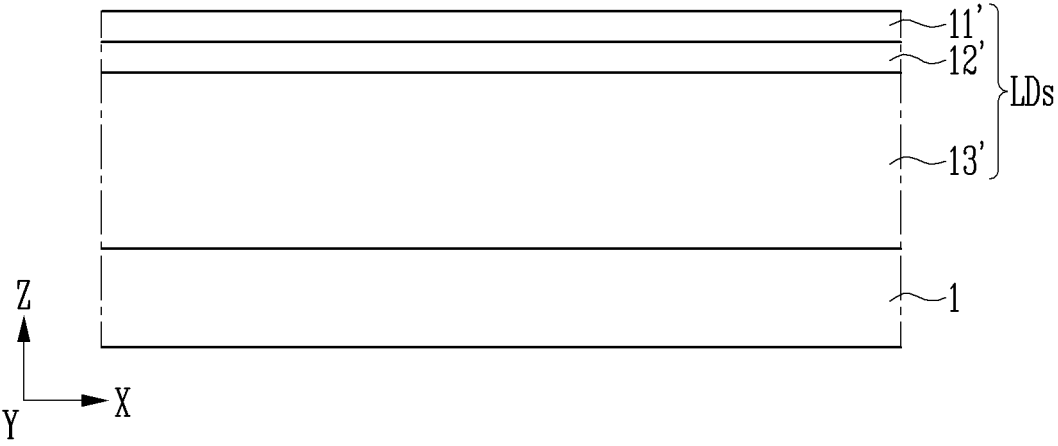
FIGS. 6 to 10 are schematic process cross-sectional views illustrating a manufacturing method for a light emitting element in accordance with an embodiment of the disclosure.

Referring to FIG. 6, a light emitting stack structure LDs may be formed on a stack substrate 1.

The stack substrate 1 may include a sapphire substrate and a transparent substrate such as glass. However, the disclosure is not limited thereto, and the stack substrate 1 may be configured as a conductive substrate such as GaN, SiC, ZnO, Si, GaP, and GaAs. Hereinafter, a case where the stack substrate 1 is a sapphire substrate is exemplified and described.

The light emitting stack structure LDs may be formed by growing a seed crystal through epitaxial growth. In some embodiments, the light emitting stack structure LDs may be formed through electron-beam deposition, physical vapor deposition (PVD), chemical vapor deposition (CVD), plasma laser deposition (PLD), dual-type thermal evaporation, sputtering, or metal organic chemical vapor deposition (MOCVD). For example, the light emitting stack structure LDs may be formed through the metal organic chemical vapor deposition (MOCVD), but the disclosure is not limited thereto.

Figure 7:
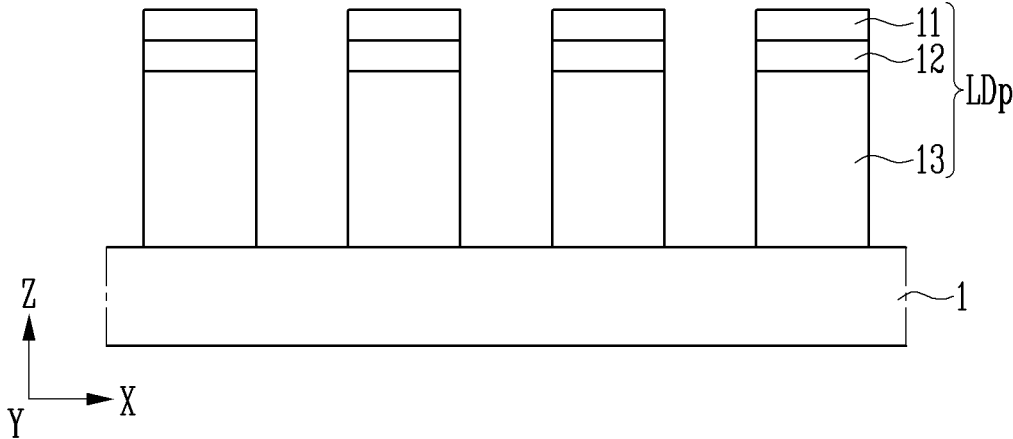

The light emitting stack structure LDs may include a layer 11' for forming a first semiconductor layer 11 (e.g., refer to FIG. 7), a layer 12' for forming an active layer 12 (e.g., refer to FIG. 7), and a layer 13' for forming a second semiconductor layer 13 (e.g., refer to FIG. 7). Although the layer 13' for forming the second semiconductor layer 13 (e.g., refer to FIG. 7) may be first formed on the stack substrate 1, and the layer 12' for forming the active layer 12 and the layer 11' for forming the first semiconductor layer 11 (e.g., refer to FIG. 7) may be sequentially formed on the layer 13' for forming the second semiconductor layer 13 (e.g., refer to FIG. 7) in FIG. 6, the disclosure is not limited thereto. In some embodiments, the layer 11' for forming the first semiconductor layer 11 (e.g., refer to FIG. 7) may be first formed on the stack substrate 1, and the layer 12' for forming the active layer 12 (e.g., refer to FIG. 7) and the layer 13' for forming the second semiconductor layer 13 (e.g., refer to FIG. 7) may be sequentially formed to manufacture the light emitting elements LD shown in FIGS. 1 and 2.

Although not separately shown in the drawing, a buffer layer and/or a sacrificial layer may be further disposed between the stack substrate 1 and the layer 13' for forming the second semiconductor layer 13 (e.g., refer to FIG. 7). The buffer layer (not shown) may reduce a lattice constant difference between the stack substrate 1 and the layer 12' for forming the second semiconductor layer 12 (e.g., refer to FIG. 7). For example, the buffer layer may include an undoped semiconductor. The buffer layer (not shown) may include a material substantially identical to that of the second semiconductor 13 (e.g., refer to FIG. 7), and the material may be undoped with an n-type or p-type impurity. In an embodiment, the buffer layer may include at least one of InAlGaN, GaN, AlGaN, InGaN, AlN, and InN, but the disclosure is not limited thereto. The sacrificial layer may include a material with which crystals of a semiconductor layer may be smoothly grown in a subsequent process. The sacrificial layer may include at least one of an insulating material and a conductive material. For example, the sacrificial layer may include silicon oxide ($SiO_x$), silicon nitride ($SiN_x$), silicon oxynitride ($SiO_xN_y$), or the like as the insulating material, and include ITO, IZO, IGO, ZnO, graphene, graphene oxide, or the like the conductive material. However, the disclosure is not limited thereto.

Referring to FIG. 7, subsequently, light emitting patterns LDp are formed by etching the light emitting stack structure LDs. The process of etching the light emitting stack structure LDs (e.g., refer to FIG. 6) may be performed by using an etching method. For example, the etching process may be dry etching, wet etching, reactive ion etching (RIE), inductively coupled plasma reactive ion etching (ICP-RIE), or the like.

Figure 8:
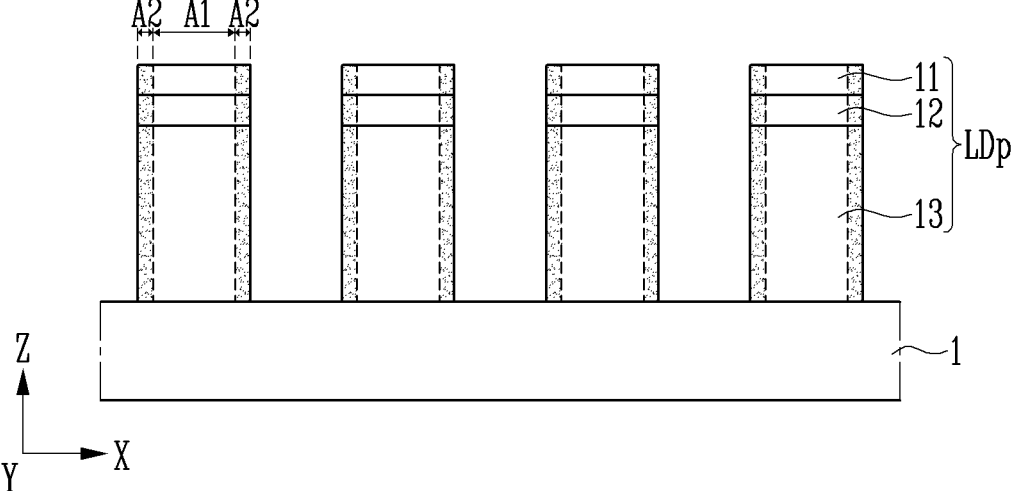

Referring to FIG. 8, subsequently, a doping area A2 is formed by implanting a dopant into a surface of each of the light emitting patterns LDp. The doping area A2 may be formed by implanting the dopant into surfaces of the first semiconductor layer 11, the active layer 12, and/or the second semiconductor layer 13 of each of the light emitting patterns LDp. The dopant may be a first dopant including at least one of Zn, Fe, Mg, Be, Cd, Ag, C, Hg, Li, and Ca. As another example, the dopant may be a second dopant including at least one of Si, Sn, Te, Se, S, O, Ti, and Ge. However, the disclosure is not limited thereto.

In the process of doping the first semiconductor layer 11, the active layer 12, and/or the second semiconductor layer 13, a core area A1 surrounded by the doping area A2 may not be doped. A doping concentration of the doping area A2 may be in a range of about $1E16/cm^3$ to about $1E23/cm^3$, but the disclosure is not limited thereto. The doping concentration of the doping area A2 may be variously changed within a range in which a surface energy band bending phenomenon may be minimized by adjusting a Fermi energy level. The doping process may be performed by using various methods. However, for example, ion implantation may be used as the doping process.

A thickness (or depth) of the doping area A2 in a first direction (e.g., X-axis direction) may be smaller than a diameter of the core area A1 in the first direction (e.g., X-axis direction). In case that the thickness of the doping area A2 in the first direction (e.g., X-axis direction) is excessively greater than the diameter of the core area A1 in the first direction (e.g., X-axis direction), an internal defect of the core area A1 is caused, and the flow of current in the core area A1 may be influenced. However, in an embodiment, the thickness of the doping area A2 in the first direction (e.g., X-axis direction) may not be excessively greater than the diameter of the core area A1 in the first direction (e.g., X-axis direction). For example, the diameter of the core area A1 in the first direction (e.g., X-axis direction) may be in a range of about 500 nm to about 600 nm, and the thickness of the doping area A2 in the first direction (e.g., X-axis direction) may be about 100 nm or less. However, the disclosure is not limited thereto, and the thickness of the doping area A2 in the first direction (e.g., X-axis direction) may be variously changed within a range in which the flow of current in the core area A1 is not influenced.

Figure 9:
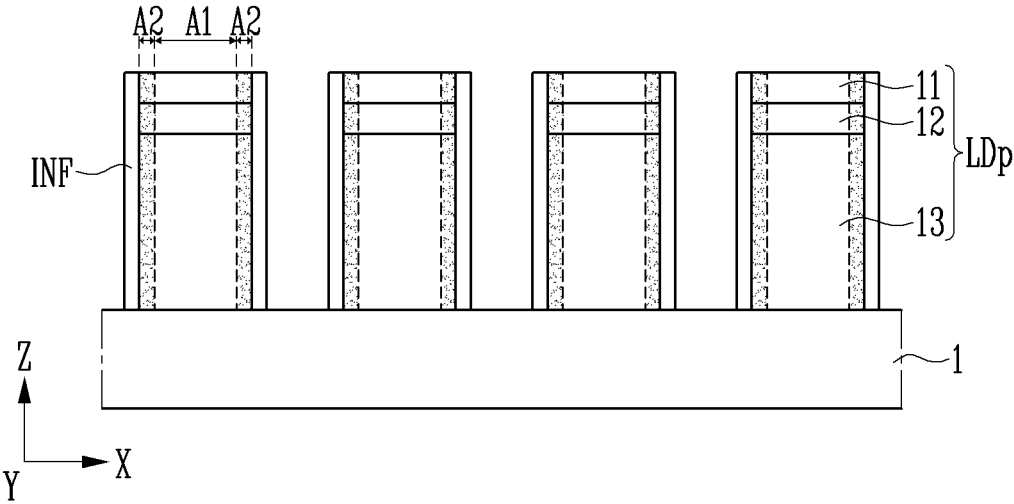

Referring to FIG. 9, subsequently, an insulative film INF may be formed on a surface of each of the light emitting patterns LDp. The insulative film INF may be formed on the doping area A2 of each of the light emitting pattern LDp. The insulative film INF may surround the doping area A2 of each of the light emitting pattern LDp. The insulative film INF may be formed on the first semiconductor layer 11, the active layer, and/or the second semiconductor layer 13. The insulative film INF may be formed (e.g., directly formed) on surfaces of the first semiconductor layer 11, the active layer 12, and/or the second semiconductor layer 13.

The insulative film INF may expose first and second end portions EP1 and EP2 (e.g., refer to FIG. 2) of the light emitting element LD (e.g., refer to FIG. 2), which have different polarities. In some embodiments, the insulative film INF may expose side portions of the semiconductor layers 11 and 13 adjacent to the first and second end portions EP1 and EP2 (e.g., refer to FIG. 2) of the light emitting element LD (e.g., refer to FIG. 2).

The insulative film INF may prevent an electrical short circuit which may occur in case that the active layer 12 contacts (or is in contact with) a conductive material except the first and second semiconductor layers 11 and 13. Also, the insulative film INF may minimize a surface defect of light emitting elements LD (e.g., refer to FIG. 2), and the lifespan and light emission efficiency of the light emitting elements LD (e.g., refer to FIG. 2) may be improved.

The insulative film INF may be formed of at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). For example, the insulative film INF may be formed as a double layer, and layers constituting the double layer of the insulative film INF may include different materials. For example, the insulative film INF may be formed as a double layer including aluminum oxide ($AlO_x$) and silicon oxide ($SiO_x$), but the disclosure is not limited thereto. In some embodiments, the insulative film INF may be omitted.

Figure 10:
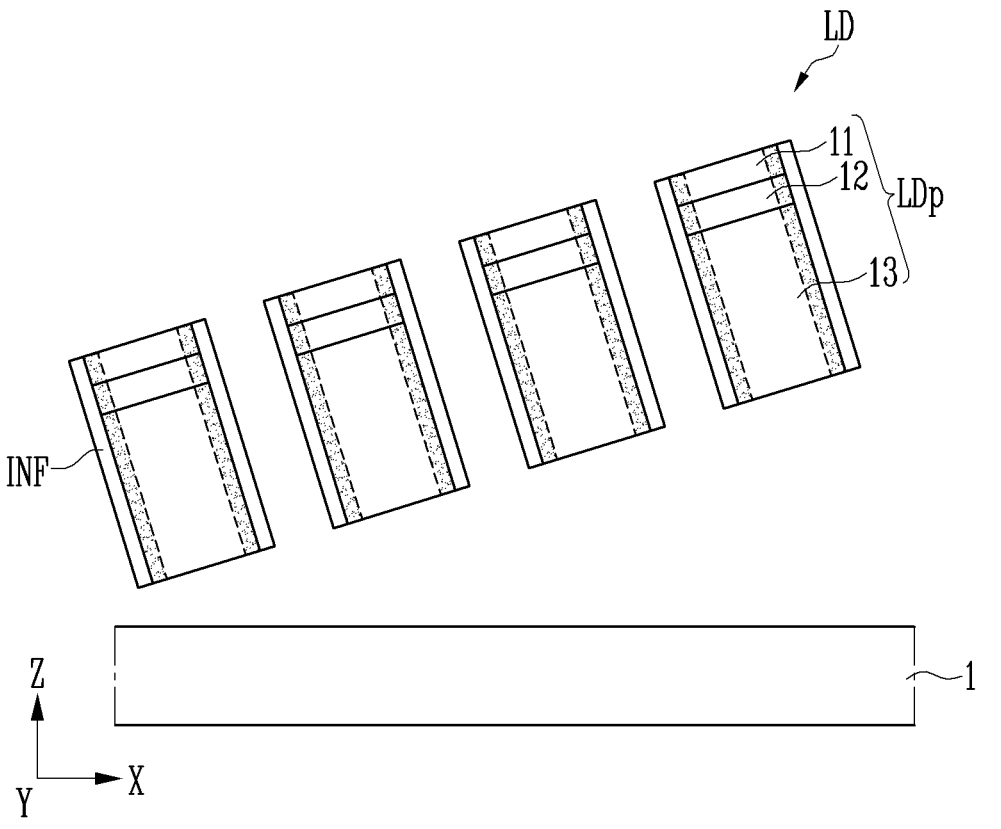

Referring to FIG. 10, subsequently, the light emitting patterns LDp may be separated from the stack substrate 1, thereby manufacturing the light emitting elements LD shown in FIGS. 1 and 2.

According to the manufacturing method of the light emitting element LD in accordance with the above-described embodiment, a surface of the light emitting element LD may be selectively doped to form the doping area A2 having a thickness, even in case that a defect occurs in the surface of the light emitting element LD in a process of etching the light emitting element LD. Thus, the surface energy band bending phenomenon may be minimized, and the efficiency and reliability of the light emitting element LD may be improved.

Continuously, a display device including the light emitting elements in accordance with the above-described embodiments will be described.

Figure 11:
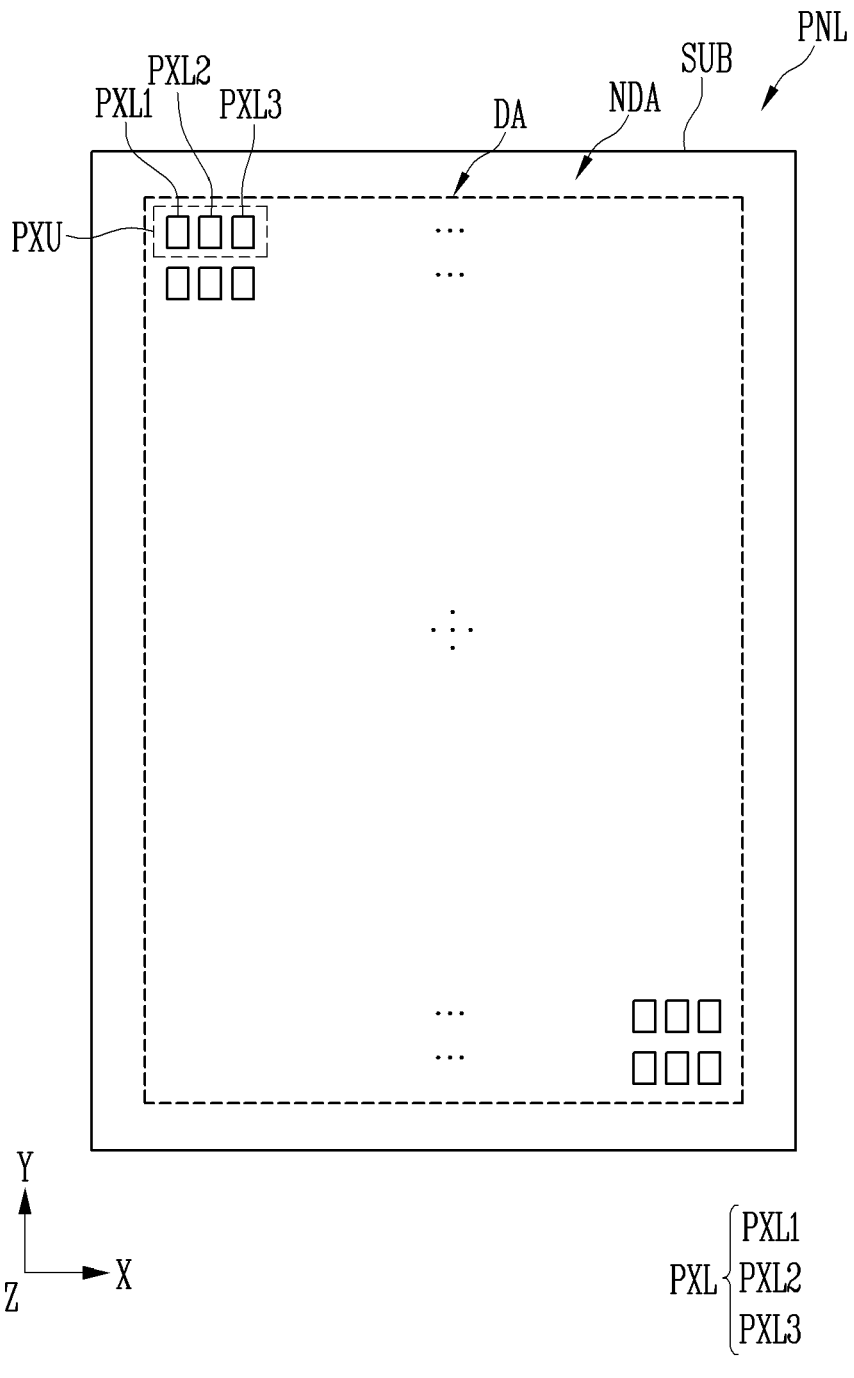
FIG. 11 is a schematic plan view illustrating a display device in accordance with an embodiment of the disclosure.

FIG. 11 is a schematic plan view illustrating a display device in accordance with an embodiment of the disclosure.

In FIG. 11, a display device, specifically, a display panel PNL provided in the display device will be illustrated as an example of an electronic device which can use, as a light source, the light emitting element LD described in the embodiments shown in FIGS. 1 to 5.

Each pixel part PXU of the display panel PNL and each sub-pixel PXL constituting the pixel part PXU may include at least one light emitting element LD. For example, each of the pixel parts PXU and the sub-pixels PXL may include the at least one light emitting element LD. For convenience of description, in FIG. 11, a structure of the display panel PNL will be briefly illustrated based on a display area DA. However, in some embodiments, at least one driving circuit (e.g., at least one of a scan driver and a data driver), lines, and/or pads, which are not shown in the drawing, may be further disposed in the display panel PNL.

Referring to FIG. 11, the display panel PNL may include a substrate SUB and the pixel part PXU disposed on the substrate SUB. The pixel part PXU may include a first sub-pixel PXL1, a second sub-pixel PXL2, and/or a third sub-pixel PXL3. Hereinafter, in case that at least one sub-pixel PXL of the first sub-pixel PXL1, the second sub-pixel PXL2, and the third sub-pixel PXL3 is arbitrarily designated or in case that two or more kinds of sub-pixels PXL of the first sub-pixel PXL1, the second sub-pixel PXL2, and the third sub-pixel PXL3 are inclusively designated, the corresponding sub-pixel or the corresponding sub-pixels will be referred to as a "sub-pixel PXL" or "sub-pixels PXL."

The substrate SUB may constitute a base member of the display panel PNL, and may be a rigid or flexible substrate or film. For example, the substrate SUB may be configured as a rigid substrate made of glass or tempered glass, or a flexible substrate (or thin film) made of a plastic or metallic material. The material and/or property of the substrate SUB is not limited thereto.

The display panel PNL and the substrate SUB for forming the same may include a display area DA for displaying an image and a non-display area NDA except the display area DA. Sub-pixels PXL may be arranged in the display area DA. Various lines, pads, and/or a built-in circuit, which are electrically connected to the sub-pixels PXL of the display area DA, may be disposed in the non-display are NDA. The sub-pixels PXL may be arranged (e.g., regularly arranged) in the display area DA according to a stripe structure, a PENTILE™ structure, or the like. However, the arrangement structure of the sub-pixels PXL is not limited thereto, and the sub-pixels PXL may be arranged in the display area DA by using various structures and/or methods.

In some embodiments, two or more kinds of sub-pixels PXL emitting lights of different colors. For example, first sub-pixels PXL1 emitting light of a first color, second sub-pixels PXL2 emitting light of a second color, and third sub-pixels PXL3 emitting light of a third color may be arranged in the display area DA. At least one first sub-pixel PXL1, a least one second sub-pixel PXL2, and at least one third sub-pixel PXL3, which are disposed adjacent to each other, may constitute a pixel unit PXU capable of emitting lights of various colors. For example, each of the first to third sub-pixels PXL1, PXL2, and PXL3 may be a sub-pixel emitting light of a color (e.g., a predetermined or selected color). In some embodiments, the first sub-pixel PXL1 may be a red pixel emitting light of red, the second sub-pixel PXL2 may be a green pixel emitting light of green, and the third sub-pixel PXL3 may be a blue pixel emitting light of blue. However, the disclosure is not limited thereto.

For embodiment, the first sub-pixel PXL1, the second sub-pixel PXL2, and the third sub-pixel PXL3 may have light emitting elements emitting light of a same color, and may include color conversion layers and/or color filters of different colors, which are disposed on the respective light emitting elements, to respectively emit lights of the first color, the second color, and the third color. In another embodiment, the first sub-pixel PXL1, the second sub-pixel PXL2, and the third sub-pixel PXL3 respectively may have a light emitting element of the first color, a light emitting element of the second color, and a light emitting element of the third color as light sources. Thus, the light emitting elements may respectively emit the lights of the first color, the second color, and the third color. However, the color, kind, and/or number of the sub-pixels PXL constituting each pixel part PXU are not limited thereto. For example, the color of light emitted by each sub-pixel PXL may be variously changed.

The sub-pixel PXL may include at least one light source driven by a control signal (e.g., a scan signal and a data signal) and/or a power source (e.g., a first power source and a second power source). In an embodiment, the light source may include at least one light emitting element LD in accordance with the embodiment shown in FIGS. 1 and 2. For example, the light source may include a subminiature pillar-shaped light emitting element LD having a size small to a degree of nanometer scale to micrometer scale. However, the disclosure is not limited thereto. Various types of light emitting elements LD may be used as the light source of the sub-pixel PXL.

In an embodiment, each sub-pixel PXL may be configured as an active pixel. However, the kind, structure, and/or driving method of sub-pixels PXL which may be applied to the display device are not limited thereto. For example, each sub-pixel PXL may be configured as a pixel of a passive or active light emitting display device using various structures and/or driving methods.

Figure 12:
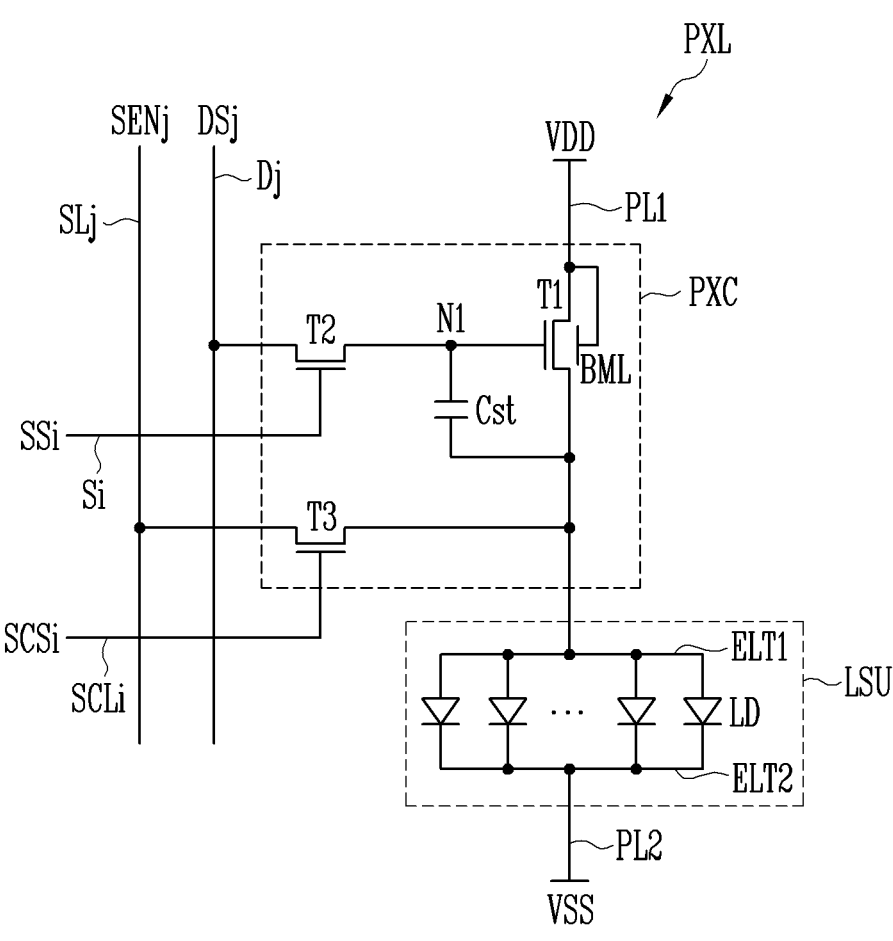
FIG. 12 is a schematic diagram of an equivalent circuit illustrating a sub-pixel in accordance with an embodiment of the disclosure.

FIG. 12 is a schematic diagram of an equivalent circuit illustrating a sub-pixel in accordance with an embodiment of the disclosure.

Referring to FIG. 12, the pixel PXL may include a light emitting part LSU for generating light with a luminance corresponding to a data signal and a pixel circuit PXC for driving the light emitting part LSU.

The light emitting part LSU may include at least one light emitting element LD electrically connected between a first power source VDD and a second power source VSS. For example, the light emitting part LSU may include a first electrode ELT1, a second electrode ELT2, and light emitting elements LD. The first electrode ELT1 may be electrically connected to the first power source VDD via the pixel circuit PXC and a first power line PL1. The second electrode ELT2 of the light emitting part LSU may be electrically connected to the second power source VSS through a second power line PL2. The light emitting elements LD may be electrically connected between the first and second electrodes ELT1 and ELT2 of the light emitting part LSU. In an embodiment, the first electrode ELT1 of the light emitting part LSU may be an anode electrode, and the second electrode ELT2 of the light emitting part LSU may be a cathode electrode.

Each of the light emitting elements LD may include a first end portion electrically connected to the first power source VDD through the first electrode ELT1 of the light emitting part LSU and/or the pixel circuit PXC and a second end portion electrically connected to the second power source VSS through the second electrode ELT2 of the light emitting part LSU. For example, the light emitting elements LD may be electrically connected in a forward direction between the first and second electrodes ELT1 and ELT2 of the light emitting part LSU. The light emitting elements LD electrically connected in the forward direction between the first power source VDD and the second power source VSS may respectively form effective light sources, and these effective light sources may constitute the light emitting part LSU of the sub-pixel PXL.

The first power source VDD and the second power source VSS may have different potentials, and the light emitting elements LD may emit light. For example, the first power source VDD may be set as a high-potential power source, and the second power source VSS may be set as a low-potential power source. A potential difference between the first power source VDD and the second power source VSS may be set to be equal to or higher than a threshold voltage of the light emitting elements LD during at least an emission period of the sub-pixel PXL.

An end portions of the light emitting elements LD constituting each light emitting part LSU may be commonly connected to the pixel circuit PXC through an electrode of the light emitting part LSU (e.g., the first electrode ELT1 of each sub-pixel PXL), and be electrically connected to the first power source VDD through the pixel circuit PXC and the first power line PL1. Another end portions of the light emitting elements LD may be commonly connected to the second power source VSS through another electrode of the light emitting part LSU (e.g., the second electrode ELT2 of each sub-pixel PXL) and the second power line PL2.

The light emitting elements LD may emit light with a luminance corresponding to a driving current supplied through a corresponding pixel circuit PXC. For example, the pixel circuit PXC may supply, to the light emitting part LSU, a driving current corresponding to a grayscale value to be expressed in a corresponding frame, during each frame period. The driving current supplied to the light emitting part LSU may be divided to flow through the light emitting elements connected in the forward direction. Accordingly, the light emitting part LSU may emit the light with the luminance corresponding to the driving current, and each light emitting element LD may emit light with a luminance corresponding to a current flowing therethrough.

The pixel circuit PXC may be electrically connected between the first power source VDD and the first electrode ELT1 of the light emitting part LSU. The pixel circuit PXC may be electrically connected to a scan line Si and a data line Dj of a corresponding sub-pixel PXL. For example, in case that the sub-pixel PXL is disposed on an ith (i is a natural number) horizontal line (or row) and a jth (j is a natural number) vertical line (or column) of the display area DA, the pixel circuit PXC may be electrically connected to an ith scan line Si and a jth data line Dj.

In some embodiments, the pixel circuit PXC may include transistors T1, T2, and T3 and at least one storage capacitor Cst.

A first transistor T1 may be electrically connected between the first power source VDD and the light emitting part LSU. For example, a first electrode (e.g., a drain electrode) of the first transistor T1 may be electrically connected to the first power source VDD, and a second electrode (e.g., a source electrode) of the first transistor T1 may be electrically connected to first electrode ELT1 of the light emitting part LSU. A gate electrode of the first transistor T1 may be electrically connected to a first node N1. The first transistor T1 may control a driving current supplied to the light emitting part LSU, which correspond to a voltage of the first node N1. For example, the first transistor T1 may be a driving transistor for controlling the driving current of the sub-pixel PXL.

In an embodiment, the first transistor T1 may further include a lower conductive layer BML (also referred to as a "lower electrode," a "back gate electrode," or a "lower light blocking layer"). The gate electrode and the lower conductive layer BML of the first transistor T1 may overlap each other in a plan view, and an insulating layer may be interposed therebetween. In an embodiment, the lower conductive layer BML may be electrically connected to an electrode, e.g., a source or drain electrode of the first transistor T1.

In case that the first transistor T1 includes the lower conductive layer BML, a back-biasing technique (or sync technique) for moving a threshold voltage of the first transistor T1 may be applied (or used) in a negative direction or positive direction by applying a back-biasing voltage to the lower conductive layer BML of the first transistor T1 in driving of the sub-pixel PXL. For example, a source-sync technique may be applied by connecting the lower conductive layer BML to a source electrode of the first transistor T1, so that the threshold voltage of the first transistor T1 may be moved in the negative direction or positive direction. In case that the lower conductive layer BML is disposed on the bottom of a semiconductor pattern constituting a channel of the first transistor T1, the lower conductive layer BML may serve as a light blocking pattern, thereby stabilizing operational characteristics of the first transistor T1. However, the function and/or application method of the lower conductive layer BML are/is not limited thereto.

A second transistor T2 may be electrically connected between the data line Dj and the first node N1. For example, a first electrode of the second transistor T2 may be electrically connected to the data line Dj, and a second electrode of the second transistor T2 may be electrically connected to the first node N1. A gate electrode of the second transistor T2 may be electrically connected to the scan line Si. The second transistor T2 may be turned on in case that a scan signal SSi having a gate-on voltage (e.g., high level voltage) is supplied from the scan line Si, to electrically connect the data line Dj and the first node N1 to each other.

A data signal DSj of a corresponding frame may be supplied to the data line Dj in each frame period. The data signal DSj may be transferred to the first node N1 through the second transistor T2 turned on during a period in which the scan signal SSi having the gate-on voltage is supplied. For example, the second transistor T2 may be a switching transistor for transferring each data signal DSj to the inside of the sub-pixel PXL.

A third transistor T3 may be electrically connected between the first transistor T1 and a sensing line SLj. For example, an electrode of the third transistor T3 may be electrically connected to the second electrode (e.g., the source electrode) of the first transistor T1, which is electrically connected to the first electrode ELT1 of the light emitting part LSU, and another electrode of the third transistor T3 may be electrically connected to the sensing line SLj. In case that the sensing line SLj is omitted, the another electrode of the third transistor T3 may be electrically connected to the data line Dj.

A gate electrode of the third transistor T3 may be electrically connected to a sensing control line SCLi. In case that the sensing control line SCLi is omitted, the gate electrode of the third transistor T3 may be electrically connected to the scan line Si. The third transistor T3 may be turned on by a sensing control signal SCSi having a gate-on voltage (e.g., a high level voltage), which is supplied to the sensing control line SCLi during a sensing period (e.g., a predetermined or selected sensing period), to electrically connect the sensing line SLj and the first transistor T1 to each other.

In some embodiments, a sensing period may be a period for extracting (or sensing) a characteristic (e.g., a threshold voltage of the first transistor T1, or the like) of each of the sub-pixels PXL disposed in the display area DA. During the sensing period, a reference voltage (e.g., a predetermined or selected reference voltage) at which the first transistor T1 may be turned on may be supplied to the first node N1 through the data line Dj and the second transistor T2, or the first transistor T1 may be turned on as each sub-pixel PXL is electrically connected to a current source or the like. In addition, the first transistor T1 may be electrically connected to the sensing line SLj as the third transistor T3 is turned on by supplying the sensing control signal SCSi having the gate-on voltage to the third transistor T3. Subsequently, a sensing signal SENj may be acquired (or sensed) through the sensing line SLj, and a characteristic of each sub-pixel PXL, including the threshold voltage of the first transistor T1, or the like, may be detected by using the sensing signal SENj. Information on the characteristic of each sub-pixel PXL may be used to convert image data such that a characteristic deviation between the sub-pixels PXL disposed in the display area DA may be compensated.

An electrode of the storage capacitor Cst may be electrically connected to the second electrode of the first transistor T1, and another electrode of the storage capacitor Cst may be electrically connected to the first node N1. The storage capacitor Cst may charge a voltage corresponding to the data signal DSj supplied to the first node N1 during each frame period.

Although all the effective light sources (i.e., light emitting elements LD) constituting each light emitting part LSU are electrically connected in parallel in FIG. 12, the disclosure is not limited thereto. For example, the light emitting part LSU of each sub-pixel PXL may be configured to include at least two-stage serial structure. Light emitting elements constituting each serial stage may be electrically connected in series to each other by at least one intermediate electrode.

Although the transistors T1, T2, and T3 included in the pixel circuit PXC are all n-type transistors in FIG. 12, the disclosure is not limited thereto. For example, at least one of the first to third transistors T1, T2, and T3 may be changed to a P-type transistor.

The structure and driving method of the sub-pixel PXL may be variously modified. For example, the pixel circuit PXC may be configured as a pixel circuit using various structures and/or various driving methods, which is different from the embodiment shown in FIG. 12.

Figure 13:
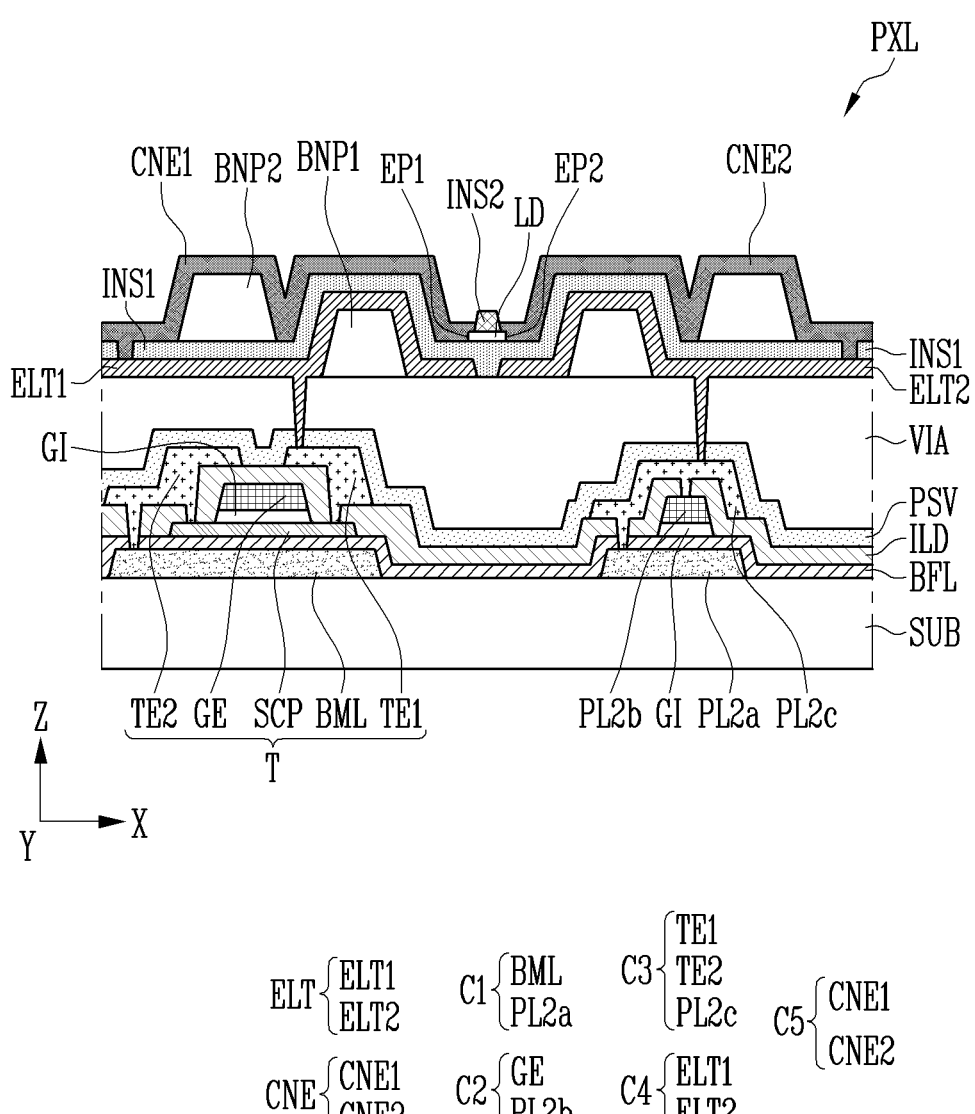
FIGS. 13 and 14 are schematic cross-sectional views illustrating a sub-pixel in accordance with an embodiment of the disclosure.
Figure 14:
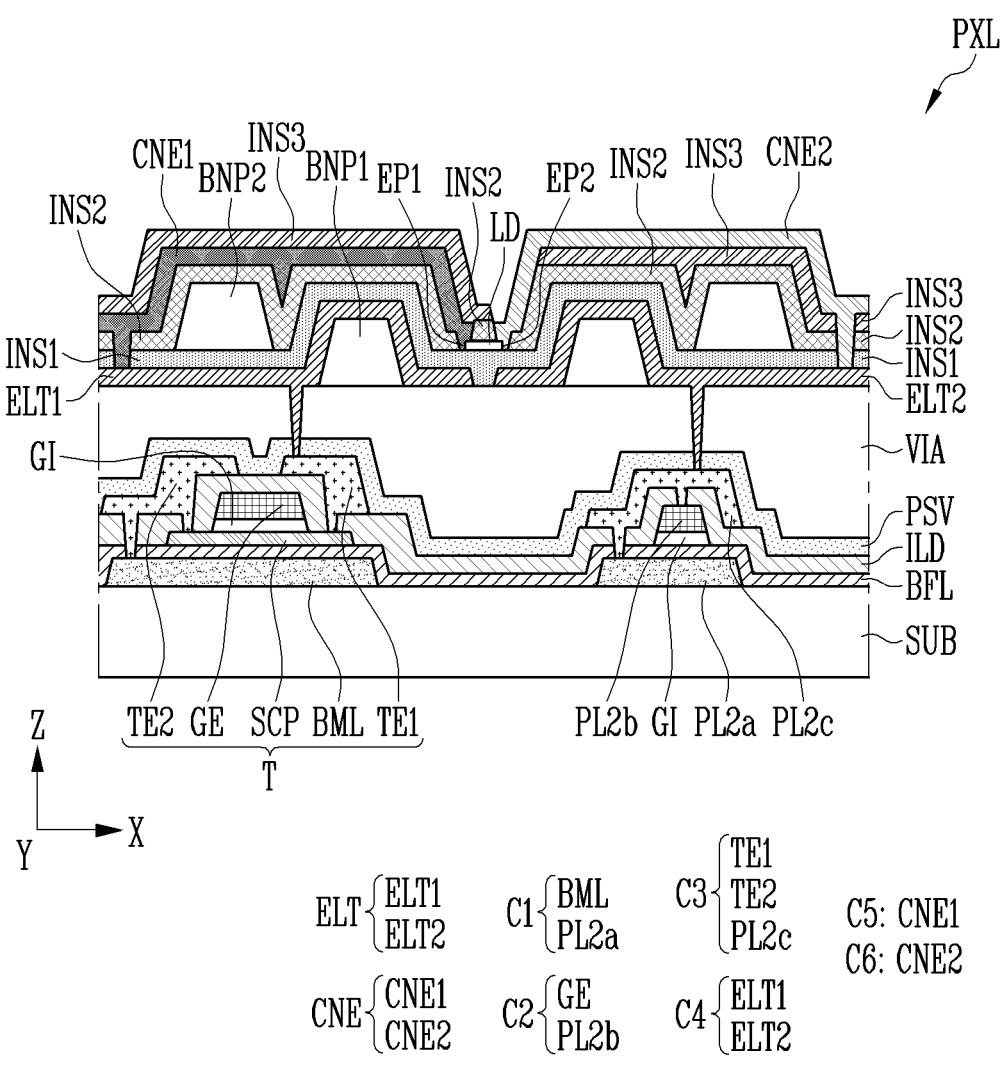

FIGS. 13 and 14 are schematic cross-sectional views illustrating a sub-pixel in accordance with an embodiment of the disclosure.

In FIGS. 13 and 14, a first transistor T1 among various circuit elements constituting the pixel circuit (PXC of FIG. 12) is illustrated. In case that first to third transistors T1, T2, and T3 are designated without being distinguished from each other, each of the first to third transistors T1, T2, and T3 is inclusively referred to as a "transistor T." The structure of transistors T and/or the positions of the transistors T for each layer are/is not limited to the embodiment shown in FIGS. 13 and 14, and may be variously changed in some embodiments.

Referring to FIGS. 13 and 14, a sub-pixel PXL in accordance with the embodiment of the disclosure may include circuit elements including transistors T disposed on a substrate SUB and various lines electrically connected thereto. First and second electrodes ELT1 and ELT2 (also, referred to as "alignment electrodes"), light emitting elements LD, and/or first and second connection electrodes CNE1 and CNE2, which constitute a light emitting part LSU (e.g., refer to FIG. 12), may be disposed above the circuit elements. Hereinafter, in case that the first and second electrodes ELT1 and ELT2 of the light emitting part LSU (e.g., refer to FIG. 12) are inclusively designated or in case that at least one of the first and second electrodes ELT1 and ELT2 of the light emitting part LSU (e.g., refer to FIG. 12) is arbitrarily designated, the corresponding electrodes or the corresponding electrode are referred to as "electrodes ELT" or an "electrode ELT." In case that the first and second connection electrodes CNE1 and CNE2 are inclusively designated or in case that at least one of the first and second connection electrodes CNE1 and CNE2 is arbitrarily designated, the corresponding electrodes or the corresponding electrode are referred to as "connection electrodes CNE" or a "connection electrode CNE."

The substrate SUB may constitute a base member, and may be a rigid or flexible substrate or film. For example, the substrate SUB may be a rigid substrate made of glass or tempered glass, a flexible substrate (or thin film) made of a plastic or metallic material, or at least one insulating layer. The material and/or property of the substrate SUB is not limited thereto. In an embodiment, the substrate SUB may be substantially transparent. The term "substantially transparent" may mean that light may be transmitted with a transmittance (e.g., a predetermined or selected transmittance) or higher. In another embodiment, the substrate SUB may be translucent or opaque. Also, the substrate SUB may include a reflective material in some embodiments.

A first conductive layer C1 may be disposed on the substrate SUB. The first conductive layer C1 may include a lower conductive layer BML of the transistor T and a first power conductive layer PL2a. The lower conductive layer BML and the first power conductive layer PL2a may be disposed in (or on) a same layer. For example, the lower conductive layer BML and the first power conductive layer PL2a may be simultaneously formed through a same process, but the disclosure is not limited thereto. The first power conductive layer PL2a may constitute the second power line PL2 described with reference to FIG. 12 and the like.

The first conductive layer C1 may be formed as a single layer or a multi-layer, which is made of at least one of molybdenum (Mo), copper (Cu), aluminum (Al), chromium (Cr), gold (Au), titanium (Ti), nickel (Ni), neodymium (Nd), and indium tin oxide (ITO), or any alloy thereof.

A buffer layer BFL may be disposed over the first conductive layer C1. The buffer layer BFL may prevent an impurity from being diffused into each circuit element. The buffer layer BFL may be configured as a single layer, but be configured as a multi-layer including at least two layers. In case that the buffer layer BFL is formed as the multi-layer, the layers of the buffer layer BFL may be formed of a same material or be formed of different materials.

A semiconductor pattern SCP may be disposed on the buffer layer BFL. For example, the semiconductor pattern SCP may include a first region contacting a first transistor electrode TE1, a second region contacting a second transistor electrode TE2, and a channel region located between the first and second regions. In some embodiments, one of the first and second regions of the semiconductor pattern SCP may be a source region, and another of first and second regions may be a drain region.

In some embodiments, the semiconductor pattern SCP may be made of poly-silicon, amorphous silicon, an oxide semiconductor, or the like. The channel region of the semiconductor pattern SCP may be a semiconductor pattern undoped with an impurity, and may be an intrinsic semiconductor. Each of the first and second regions of the semiconductor pattern SCP may be a semiconductor pattern doped with an impurity.

A gate insulating layer GI may be disposed on the buffer layer BFL and the semiconductor pattern SCP. For example, the gate insulating layer GI may be disposed between the semiconductor pattern SCP and a gate electrode GE. Also, the gate insulating layer GI may be disposed between the buffer layer BFL and a second power conductive layer PL2b. The gate insulating layer GI may be configured as a single layer or a multi-layer, and include various kinds of inorganic insulating materials, including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A second conductive layer C2 may be disposed on the gate insulating layer GI. The second conductive layer C2 may include the gate electrode GE of the transistor T and the second power conductive layer PL2b. The gate electrode GE and the second power conductive layer PL2b may be disposed in a same layer. For example, the gate electrode GE and the second power conductive layer PL2b may be simultaneously formed through a same process, but the disclosure is not limited thereto. The gate electrode GE may be disposed on the gate insulating layer GI and overlap the semiconductor pattern SCP in the third direction (e.g., Z-axis direction). The second power conductive layer PL2b may be disposed on the gate insulating layer GI and overlap the first power conductive layer PL2a in the third direction (e.g., Z-axis direction). The second power conductive layer PL2b and the first power conductive layer PL2a may constitute the second power line PL2 described with reference to FIG. 12 and the like.

The second conductive layer C2 may be formed as a single layer or a multi-layer, which is made of at least one of titanium (Ti), copper (Cu), indium tin oxide ITO, molybdenum (Mo), chromium (Cr), gold (Au), nickel (Ni), and neodymium, or any alloy thereof. For example, the second conductive layer C2 may be formed as a multi-layer in which titanium (Ti), copper (Cu), and/or indium tin oxide (ITO) are sequentially or repeatedly stacked.

An interlayer insulating layer ILD may be disposed over the second conductive layer C2. For example, the interlayer insulating layer ILD may be disposed between the gate electrode GE and the first and second transistor electrodes TE1 and TE2. Also, the interlayer insulating layer ILD may be disposed between the second power conductive layer PL2b and a third power conductive layer PL2c.

The interlayer insulating layer ILD may be configured as a single layer or a multi-layer, and include various kinds of inorganic insulating materials, including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A third conductive layer C3 may be disposed on the interlayer insulating layer ILD. The third conductive layer C3 may include the first and second transistor electrodes TE1 and TE2 of the transistor T and the third power conductive layer PL2c. The first and second transistor electrodes TE1 and TE2 and the third power conductive layer PL2c may be disposed in a same layer. For example, the first and second transistor electrodes TE1 and TE2 and the third power conductive layer PL2c may be simultaneously formed through a same process, but the disclosure is not limited thereto.

The first and second transistor electrodes TE1 and TE2 may overlap the semiconductor pattern SCP in the third direction (e.g., Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole penetrating the interlayer insulating layer ILD. The second transistor electrode TE2 may be electrically connected to the second region of the semiconductor pattern SCP through a contact hole penetrating the interlayer insulating layer ILD. Also, the second transistor electrode TE2 may be electrically connected to the lower conductive layer BML through a contact hole penetrating the interlayer insulating layer ILD and the buffer layer BFL. In some embodiments, any one of the first and second transistor electrodes TE1 and TE2 may be a source electrode, and another of the first and second transistor electrodes TE1 and TE2 may be a drain electrode.

The third power conductive layer PL2c may overlap the first power conductive layer PL2a and/or the second power conductive layer PL2b in the third direction (e.g., Z-axis direction). The third power conductive layer PL2c may be electrically connected to the first power conductive layer PL2a and/or the second power conductive layer PL2b. For example, the third power conductive layer PL2c may be electrically connected to the first power conductive layer PL2a through a contact hole penetrating the interlayer insulating layer ILD and the buffer layer BFL. Also, the third power conductive layer PL2c may be electrically connected to the second power conductive layer PL2b through a contact hole penetrating the interlayer insulating layer ILD. The third power conductive layer PL2c along with the first power conductive layer PL2a and/or the second power conductive layer PL2b may constitute the second power line PL2 described with reference to FIG. 12 and the like.

The third conductive layer C3 may be formed as a single layer or a multi-layer, which is made of at least one of aluminum (Al), molybdenum (Mo), chromium (Cr), gold (Au), titanium (Ti), nickel (Ni), neodymium (Nd), and indium tin oxide (ITO), or any alloy thereof.

A protective layer PSV may be disposed over the third conductive layer C3. The protective layer PSV may be configured as a single layer or a multi-layer, and include various kinds of inorganic insulating materials, including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A via layer VIA may be disposed on the protective layer PSV. The via layer VIA may be made of an organic material, and planarize a lower step difference. For example, the via layer VIA may include at least one organic material such as acryl resin, epoxy resin, phenolic resin, polyamides resin, polyimides resin, unsaturated polyesters resin, poly-phenylene ethers resin, poly-phenylene sulfides resin, or benzocyclobutene (BCB). However, the disclosure is not limited thereto, and the via layer VIA may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

First bank patterns BNP1 may be disposed on the via layer VIA. The first bank patterns BNP1 may have various shapes in some embodiments. In an embodiment, the first bank patterns BNP1 may have a shape protruding in the third direction (e.g., Z-axis direction) on the substrate SUB. Also, the first bank patterns BNP1 may have an inclined surface inclined at an angle (e.g., a predetermined or selected angle) with respect to the substrate SUB. However, the disclosure is not limited thereto, and the first bank patterns BNP1 may have a sidewall with a curved shape, a stepped shape, or the like. For example, the first bank patterns BNP1 may have a cross section with a semicircular shape, a semi-elliptical shape, or the like.

Electrodes and insulating layers, which are disposed on the top of the first bank patterns BNP1, may have a shape corresponding to the first bank patterns BNP1. For example, the first and second electrodes ELT1 and ELT2 of the light emitting part LSU (e.g., refer to FIG. 12) disposed over the first bank patterns BNP1 may include an inclined surface or a curved surface, which has a shape corresponding to that of the first bank patterns BNP1. Accordingly, the first bank patterns BNP1 and the first and second electrodes ELT1 and ELT2 may serve as a reflective member which guides light emitted from the light emitting elements LD in a front direction of the sub-pixel PXL, i.e., the third direction (e.g., Z-axis direction) Thus, the light emission efficiency of the display panel PNL may be improved.

The first bank patterns BNP1 may include at least on organic material and/or at least one inorganic material. For example, the first bank patterns BNP1 may include an organic material such as acryl resin, epoxy resin, phenolic resin, polyamides resin, polyimides resin, unsaturated polyesters resin, poly-phenylene ethers resin, poly-phenylene sulfides resin, or benzocyclobutene (BCB). However, the disclosure is not limited thereto, and the first bank patterns BNP1 may include various kinds of inorganic insulating materials, including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A fourth conductive layer C4 may be disposed on the via layer VIA and the first bank patterns BNP1. The fourth conductive layer C4 may include the first and second electrodes ELT1 and ELT2 of the light emitting part LSU (e.g., refer to FIG. 12). The first and second electrodes ELT1 and ELT2 may be spaced apart from each other in the sub-pixel PXL. The first and second electrodes ELT1 and ELT2 may be disposed in a same layer. For example, the first and second electrodes ELT1 and ELT2 may be simultaneously formed through a same process, but the disclosure is not limited thereto.

The first electrode ELT1 of the light emitting part LSU (e.g., refer to FIG. 12) may be electrically connected to the first transistor electrode TE1 of the transistor T through a contact hole penetrating the via layer VIA and the protective layer PSV. The second electrode ELT2 of the light emitting part LSU may be electrically connected to the third power conductive layer PL2c through a contact hole penetrating the via layer VIA and the protective layer PSV.

The first and second electrodes ELT1 and ELT2 of the light emitting part LSU (e.g., refer to FIG. 12) may be supplied with an alignment signal in a process of aligning the light emitting elements LD. Accordingly, an electric field may be formed between the first and second electrodes ELT1 and ELT2, so that light emitting elements LD provided in each sub-pixel PXL may be aligned between the first and second electrodes ELT1 and ELT2.

The fourth conductive layer C4 may include at least one conductive material. For example, the fourth conductive layer C4 may include at least one metal or any alloy including the same among various metallic materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, at least one conductive oxide such as Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), and Fluorine doped Tin Oxide (FTO), and at least one conductive material among conductive polymers such as PEDOT, and the like, but the disclosure is not limited thereto.

A first insulating layer INS1 may be disposed over the fourth conductive layer C4. The first insulating layer INS1 may be configured as a single layer or a multi-layer, and include various kinds of inorganic insulating materials, including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A second bank pattern BNP2 may be disposed on the first insulating layer INS1. The second bank pattern BNP2 may form a dam structure which defines an emission area. In a process of supplying the light emitting elements LD in the emission area, the light emitting elements LD may be supplied to each of the sub-pixels PXL. For example, a desired kind and/or amount of light emitting element ink may be supplied to the area (e.g., emission area) defined by the second bank pattern BNP2.

The second bank pattern BNP2 may include an organic material such as acryl resin, epoxy resin, phenolic resin, polyamides resin, polyimides resin, unsaturated polyesters resin, poly-phenylene ethers resin, poly-phenylene sulfides resin, or benzocyclobutene (BCB). However, the disclosure is not limited thereto, and the second bank pattern BNP2 may include various kinds of inorganic insulating materials, including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In some embodiments, the second bank pattern BNP2 may include at least one light blocking material and/or at least one reflective material. Accordingly, light leakage between adjacent sub-pixels PXL may be prevented. For example, the second bank pattern BNP2 may include at least one black matrix material and/or at least one color filter material. For example, the second bank pattern BNP2 may be formed as a black opaque pattern capable of blocking transmission of light. In an embodiment, a reflective layer or the like may be formed on a surface (e.g., a sidewall) of the second bank pattern BNP2 to increase the light efficiency of each sub-pixel PXL.

The light emitting elements LD may be disposed on the first insulating layer INS1. The light emitting elements LD may be disposed between the first and second electrodes ELT1 and ELT2 of the light emitting part LSU (e.g., refer to FIG. 12) on the first insulating layer INS1.

The light emitting elements LD may be disposed on the first insulating layer INS1. The light emitting elements LD may be disposed between the first and second electrodes ELT1 and ELT2 of the light emitting part LSU (e.g., refer to FIG. 12) on the first insulating layer INS1. The light emitting elements LD may be prepared in a form in which the light emitting elements LD are dispersed in a light emitting element ink, and the light emitting element ink including the light emitting elements LD may be supplied to each of the sub-pixels PXL through an inkjet printing process, or the like. For example, the light emitting elements LD may be dispersed in a volatile solvent, and the volatile solvent including the light emitting elements LD may be provided to each sub-pixel PXL. Subsequently, in case that an alignment signal is supplied through the first and second electrodes ELT1 and ELT2, an electric field may be formed between the first and second electrodes ELT1 and ELT2, and the light emitting elements LD may be aligned between the first and second electrodes ELT1 and ELT2 by the electric field. After the light emitting elements LD are aligned, the solvent may be volatilized or removed through other processes, so that the light emitting elements LD may be stably arranged between the first and second electrodes ELT1 and ELT2.

As described above, in the light emitting element LD in accordance with the embodiment of the disclosure, the doping area A2 having a predetermined thickness is formed by selectively doping a surface of the light emitting element LD, so that even in case that a defect occurs in the surface of the light emitting element LD in a process of etching the light emitting element LD. Thus, the surface energy band bending phenomenon may be minimized, thereby improving the efficiency and reliability of the light emitting element LD.

A second insulating layer INS2 may be disposed on the first insulating layer INS1 and the light emitting elements LD. For example, the second insulating layer INS2 may be partially provided on the first insulating layer INS1 and the light emitting elements LD, and expose first and second end portions EP1 and EP2 of the light emitting elements LD. In case that the second insulating layer INS2 is formed on the light emitting elements LD after the light emitting elements LD are completely aligned, the light emitting elements LD may be prevented from being separated from a position at which the light emitting elements LD are aligned. Further, the second insulating layer INS2 may be formed on the light emitting elements LD, so that the first and second connection electrodes CNE1 and CNE2 which will be described later may be stably separated from each other.

The second insulating layer INS2 may be configured as a single layer or a multi-layer, and include various kinds of inorganic insulating materials, including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first and second connection electrodes CNE1 and CNE2 may be respectively disposed on the first and second end portions EP1 and EP2 of the light emitting elements LD, which are exposed by the second insulating layer INS2. The first connection electrode CNE1 may be disposed (e.g., directly disposed) on the first end portions EP1 of the light emitting elements LD, and contact the first end portions EP1 of the light emitting elements LD. Also, the first connection electrode CNE1 may be electrically connected to the first electrode ELT1 of the light emitting part LSU (e.g., refer to FIG. 12) through a contact hole penetrating the second insulating layer INS2 and the first insulating layer INS1. The second connection electrode CNE2 may be electrically connected to the second electrode ELT2 through a contact hole penetrating the second insulating layer INS2 and the first insulating layer INS1.

Referring to FIG. 13, the first and second connection electrodes CNE1 and CNE2 may be disposed in a same layer. For example, the first and second connection electrodes CNE1 and CNE2 may constitute a fifth conductive layer C5. The first and second connection electrodes CNE1 and CNE2 may be simultaneously formed through a same process, but the disclosure is not limited thereto.

Referring to FIG. 14, first and second connection electrodes CNE1 and CNE2 may be disposed in different layers. For example, the first connection electrode CNE1 may constitute a fifth conductive layer C5, and the second connection electrode CNE2 may constitute a sixth conductive layer C6. A third insulating layer INS3 may be further disposed between the fifth conductive layer C5 and the sixth conductive layer C6. The third insulating layer INS3 may cover (or overlap in a plan view) the first connection electrode CNE1 constituting the fifth conductive layer C5, and may expose a second end portions EP2 of light emitting elements LD. The second connection electrode CNE2 constituting the sixth conductive layer C6 may be disposed on the second end portions EP2 of the light emitting elements LD, which are exposed by the third insulating layer INS3. As described above, in case that the third insulating layer INS3 is disposed between the first and second connection electrodes CNE1 and CNE2 constituting different conductive layers, the first and second connection electrodes CNE1 and CNE2 may be stably separated from each other by the third insulating layer INS3, so that the electrical stability between the first and second end portions EP1 and EP2 of the light emitting elements LD can be ensured.

The fifth conductive layer C5 and/or the sixth conductive layer C6 may be configured with various transparent conductive materials. For example, the fifth conductive layer C5 and/or the sixth conductive layer C6 may include at least one of various transparent conductive materials including Indium Tin Oxide (ITO), Indium Zinc Oxide (IZO), Indium Tin Zinc Oxide (ITZO), Aluminum doped Zinc Oxide (AZO), Gallium doped Zinc Oxide (GZO), Zinc Tin Oxide (ZTO), and Gallium Tin Oxide (GTO), and be implemented substantially transparently or translucently to satisfy a predetermined transmittance. Accordingly, light emitted from the first and second end portions EP1 and EP2 of the light emitting elements LD may be emitted to the outside of the display panel PNL while passing through the first and second connection electrodes CNE1 and CNE2.

The third insulating layer INS3 may be configured as a single layer or a multi-layer, and include various kinds of inorganic insulating materials, including silicon oxide $(SiO_x)$, silicon nitride $(SiN_x)$, silicon oxynitride $(SiO_xN_y)$, aluminum nitride $(AlN_x)$, aluminum oxide $(AlO_x)$, zirconium oxide $(ZrO_x)$, hafnium oxide $(HfO_x)$, and titanium oxide $(TiO_x)$.

In accordance with the disclosure, a surface of the light emitting element may be doped to form a doping area having a thickness. Thus, although a defect occurs in the surface of the light emitting element in a process of etching the light emitting element, the surface energy band bending phenomenon may be minimized. Therefore, the efficiency and reliability of the light emitting element may be improved.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a first electrode and a second electrode spaced apart from each other; and
a light emitting element disposed between the first electrode and the second electrode, the light emitting element comprising a first semiconductor layer, a second semiconductor layer on the first semiconductor layer, and an active layer between the first semiconductor layer and the second semiconductor layer,
wherein the light emitting element includes a core area and a doping area surrounding the core area,
wherein a doping concentration of the doping area is higher than a doping concentration of the core area, and
wherein the doping area includes an outer portion of at least one of the first semiconductor layer, the second semiconductor layer, or the active layer.

2. The display device of claim 1, wherein the doping area overlaps the first semiconductor layer, the second semiconductor layer, and the active layer in a plan view.

3. The display device of claim 1, wherein the doping area partially overlaps the active layer in a plan view.

4. The display device of claim 3, wherein the active layer includes barrier layers and well layers that are alternately stacked.

5. The display device of claim 4, wherein the doping area overlaps the barrier layers and the well layers in a plan view.

6. The display device of claim 4, wherein the doping area partially overlaps the well layers in a plan view.

7. The display device of claim 1, wherein a thickness of the doping area is smaller than a diameter of the core area.

8. The display device of claim 7, wherein the thickness of the doping area is about 100 nm or less.

9. The display device of claim 1, further comprising:
an insulative film surrounding the doping area.

10. The display device of claim 1, further comprising:
a first connection electrode electrically connected to the first semiconductor layer;
and a second connection electrode electrically connected to the second semiconductor layer.

* * * * *